(12) United States Patent
Sumitani

(10) Patent No.: US 6,301,154 B1
(45) Date of Patent: Oct. 9, 2001

(54) SEMICONDUCTOR MEMORY DEVICE HAVING FLOATING GATE TYPE TRANSISTORS PROGRAMMED TO HAVE DIFFERING THRESHOLD VOLTAGES

(75) Inventor: Ken Sumitani, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/497,318

(22) Filed: Feb. 3, 2000

(30) Foreign Application Priority Data

Mar. 30, 1999 (JP) .................................................. 11-088582

(51) Int. Cl.$^7$ .................................................... G11C 16/04
(52) U.S. Cl. .................................. 365/185.18; 365/185.2; 365/185.21; 365/185.22
(58) Field of Search .......................... 365/185.18, 185.2, 365/185.21, 185.22, 185.01

(56) References Cited

U.S. PATENT DOCUMENTS

| 5,267,213 | 11/1993 | Sung ..................................... 365/226 |
| 5,602,777 | 2/1997 | Nawaki et al. . | |
| 5,966,330 | * 10/1999 | Tang et al. ......................... 365/185.2 |

* cited by examiner

Primary Examiner—Hoai V. Ho
(74) Attorney, Agent, or Firm—Morrison & Foerster LLP

(57) ABSTRACT

A semiconductor memory device of the present invention is designed so as to comprise (1) first and second transistors of a floating gate type, programmed so as to have different threshold voltages, (2) a latch circuit for producing binary data according to a difference between the threshold voltages, upon turning on of the first and second transistors, and retaining the binary data, and (3) a bias voltage switching circuit that selects either a first voltage or a voltage obtained by raising the first voltage in the case of actuation by the first voltage, depending on on/off of a set-up signal SETUP, whereas selects either a second voltage lower than the first voltage or a voltage obtained by raising the second voltage in the case of actuation by the second voltage in response to input of the set-up signal SETUP, depending on whether the second voltage has a normal value or a value exceeding the same, and outputs the selected voltage to the gates of the first and second transistors. This provides a semiconductor memory device that normally operates with a power source voltage in any one of a plurality of ranges and is capable of maintaining a stable operation when the power source voltage fluctuates.

11 Claims, 5 Drawing Sheets

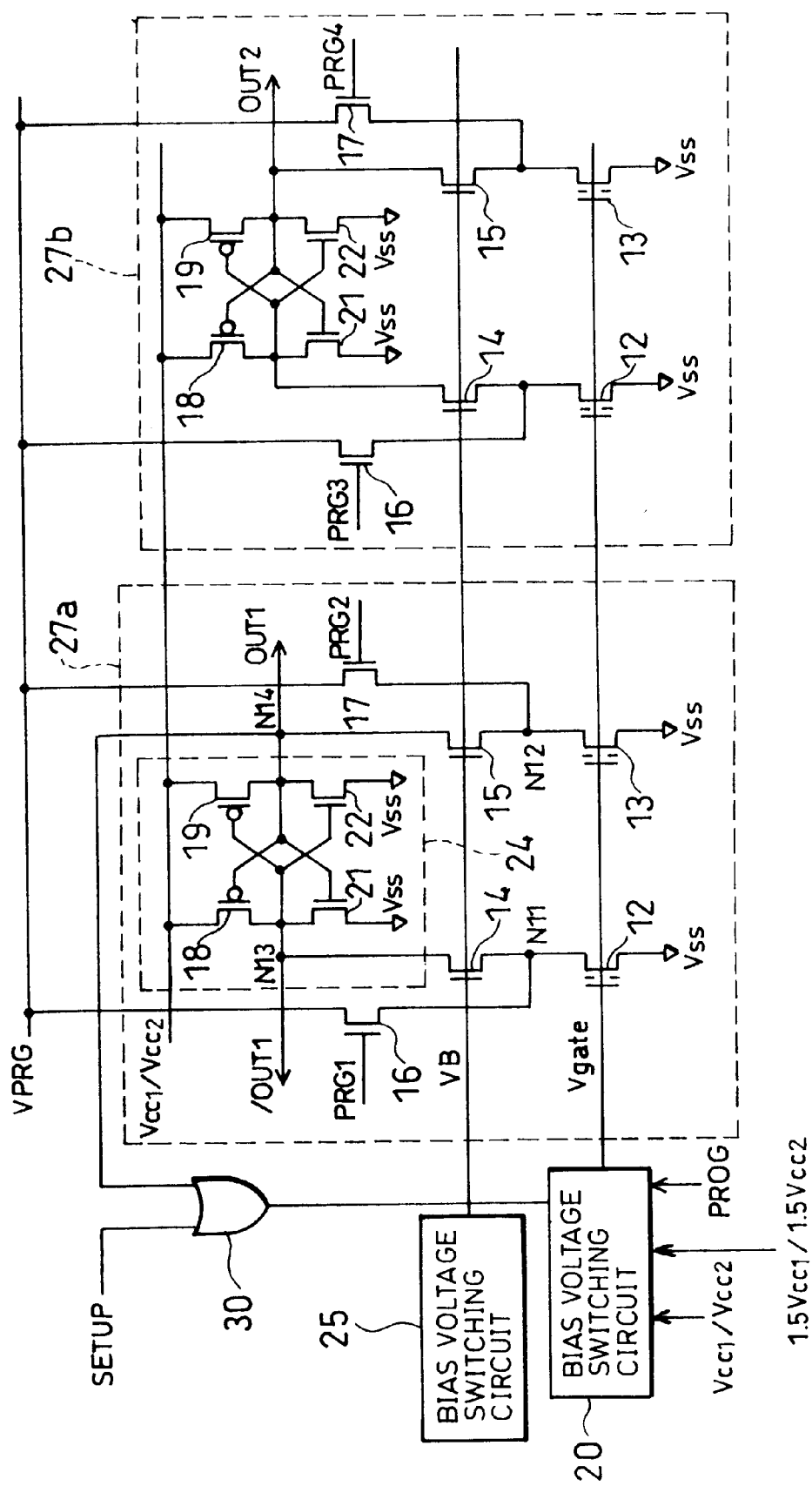

FIG.2(a) LOW VOLTAGE VERSION
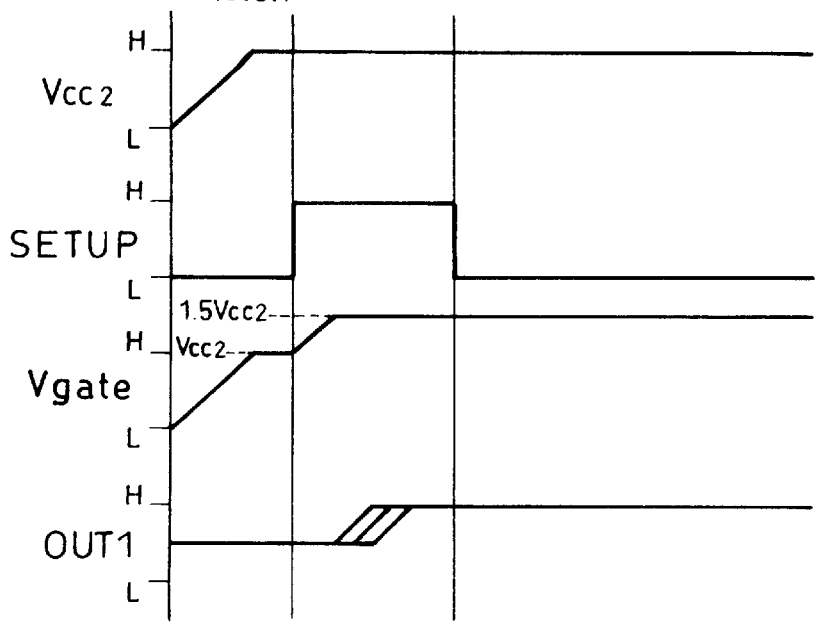
FIG.2(b) NORMAL VOLTAGE VERSION
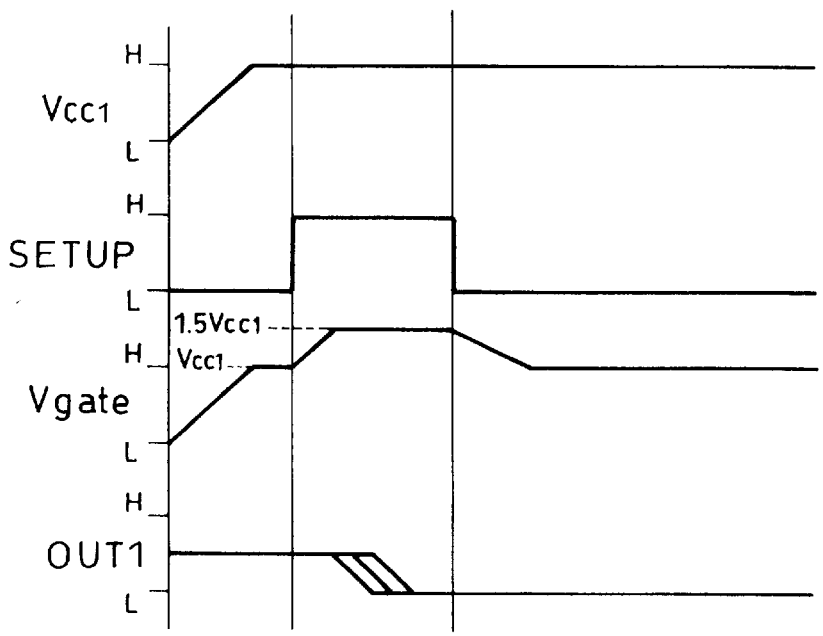

IN THE CASE OF NORMAL VOLTAGE VERSION

IN THE CASE OF LOW VOLTAGE VERSION

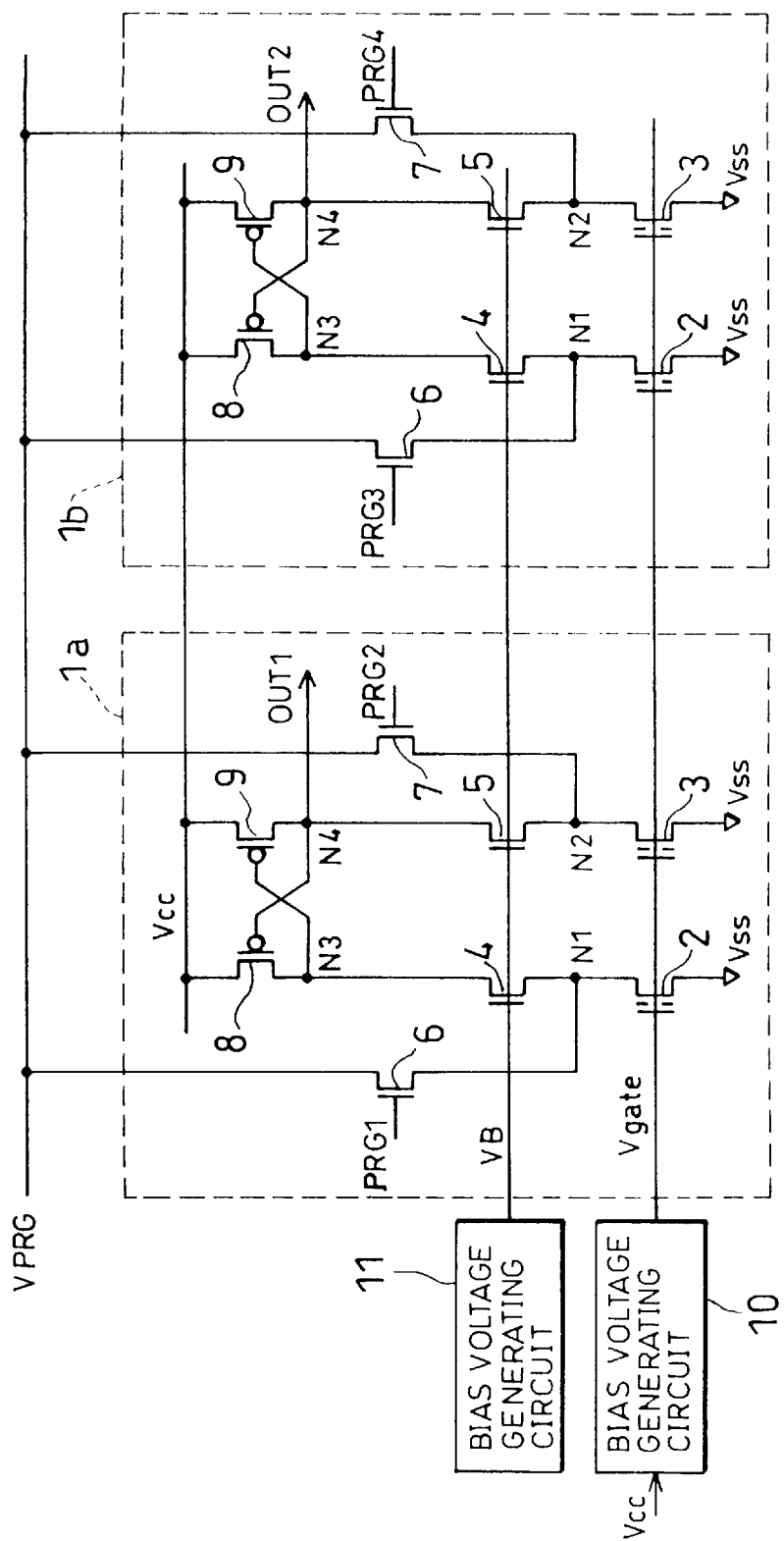

SEMICONDUCTOR MEMORY DEVICE HAVING FLOATING GATE TYPE TRANSISTORS PROGRAMMED TO HAVE DIFFERING THRESHOLD VOLTAGES

FIELD OF THE INVENTION

The present invention relates to a semiconductor memory device incorporating transistors of a floating gate type adapted so as to hold data such as redundancy-replacement-use addresses and initial states of the device.

BACKGROUND OF THE INVENTION

Recently, in memory devices of large capacity, replacement of defective memory cells by redundancy circuits is executed for eliminating errors caused by defects of memory cells. A redundancy circuit of this kind is composed of spare memory cells for substituting for defective memory cells if any, and a circuit for storing addresses of the defective memory cells (hereinafter referred to as defect address) and conducting the switching from the defective memory cells to the spare memory cells. Methods roughly classified into the following two kinds are applicable as a method of storing defect addresses, depending on a type of the device used.

First of all, for volatile memories such as DRAM and SRAM, a plurality of fuses formed with polysilicon, metal, etc. are provided in a device, and the storage of defect addresses is carried out by electrically breaking the fuses, or breaking the same by a laser beam or the like.

Conventionally, since memory cells are nonvolatile per se in EPROMS, flash memories, and the like, the memory cells are, instead of fuses, adopted as memory elements so as to store defect addresses to be redundancy-saved and initial states of the device.

FIG. 5 is a circuit diagram showing a memory circuit for storing defect addresses to be redundancy-saved, or a memory circuit for storing initial states of the device, used in a conventional EPROM or flash memory. Such a memory circuit is hereinafter referred to as an option circuit. Such an option circuit is disclosed by the U.S. Pat. No. 5,267,213 (Issue Date: Nov. 30, 1993), for example.

An option circuit 1a is designed so as to store one bit of, for example, a defect address, composed of two floating-gate-type transistors (hereinafter referred to as floating gate transistors) 2 and 3, N-type transistors 4, 5, 6, and 7, and P-type transistors 8 and 9. Generally, such a memory circuit is called as CAM (content addressable memory) cell. A bias voltage V gate that is an output of a bias voltage generating circuit 10 is supplied to each gate of the floating gate transistors 2 and 3 in the option circuit 1a thus designed. To each gate of the N-type transistors 4 and 5, an output of a bias voltage generating circuit 11 is commonly supplied.

These P-type transistor 8, N-type transistor 4, and floating gate transistor 2 are connected in series in this order between a power source voltage Vcc level and a power source voltage Vss level (ground level), while likewise these P-type transistor 9, N-type transistor 5, and floating gate transistor 3 are connected in series in this order between the power source voltage Vcc level and the power source voltage Vss level.

A gate of the P-type transistor 8 is connected with a node N4 that connects the P-type transistor 9 and the N-type transistor 5 with each other, while a gate of the P-type transistor 9 is connected with a node N3 that connects the P-type transistor 8 and the N-type transistor 4 with each other. Further, a program voltage VPRG (about 10–12V) is supplied to each drain of the N-type transistors 6 and 7, while program signals PRG1 and PRG2 are supplied to gates of the N-type transistors 6 and 7, respectively.

A source of the N-type transistor 6 is connected with a node N1 that connects the floating gate transistor 2 and the N-type transistor 4 with each other, while a source of the N-type transistor 7 is connected with a node N2 that connects the floating gate transistor 3 and the N-type transistor 5 with each other.

The option circuit 1a outputs an output OUT 1 via the node N4 that connects the P-type transistor 9 and the N-type transistor 5 with each other. A plurality of such option circuits are provided (for conveniences' sake, FIG. 5 shows a case where two of the same are provided), and an option circuit 1b is designed so that program signals PRG3 and PRG4 are supplied to gates of the N-type transistors 6 and 7, respectively, and that an output OUT 2 is outputted via the node N4 that connects the P-type transistor 9 and the N-type transistor 5 with each other.

The following description will explain an operation in accordance with the foregoing arrangement. First of all, a case where this option circuit 1a is made to store a single bit will be explained below. Specifically, a case where a "0" state of binary logic is stored (programmed) by the option circuit 1a will be explained as an example of the operation.

All memory cells of the floating gate type (transistors 2 and 3) inside the foregoing option circuit 1a are in a state of being erased by ultra violet (ultra-violet erasure), and their threshold voltages are neutralized to about 2V to 3V.

The bias voltage generation circuit 10 is normally designed to output the power source voltage Vcc, but an output of the bias voltage generating circuit 10 is set to as high as not lower than 10V, whereas a bias voltage outputted by the bias voltage generating circuit 11 is lowered to a Vss level, upon programming. This causes the N-type transistors 4 and 5 to be turned off, while only the program signal PRG1 is raised to about 7V to 8V.

In this state, for a predetermined period of time, the program voltage VPRG (about 10V to 12V) is supplied to the drains of the N-type transistors 6 and 7, but since the N-type transistor 7 is off while the N-type transistor 6 is on, a voltage of about 6V to 7V is applied to the drain side (the foregoing node N1) of the floating gate transistor 2 via the N-type transistor 6.

This provides current flow between the drain and source of the floating gate transistor 2. Hot electrons generated by the current are injected into a floating gate of the floating gate transistor 2 by a bias voltage (Vgate) applied to the floating gate transistor 2. This causes the threshold voltage of the transistor 2 to increase. As a result, the threshold voltage is raised to about the power source voltage Vcc or above. On the other hand, the threshold voltage of the floating gate transistor 3 remains neutralized to about 2V to 3V. Thus, with a difference between the threshold voltages of the floating gate transistors 2 and 3, the option circuit 1 is made to store "0". This is identical to write-in to a common hot-electron-injected EPROM, flash memory, etc.

Next, a case where "1" is stored by the option circuit 1a will be explained below.

Only the program signal PRG2 is set not lower than the power source voltage Vcc. In this state, for a predetermined period of time, the program voltage VPRG (about 10V to 12V) is supplied to the drains of the N-type transistors 6 and 7. Since the N-type transistor 6 is off while only the N-type transistor 7 is on, a voltage of about 6V to 7V is applied to the drain side (the foregoing node N2) of the floating gate transistor 3 via the N-type transistor 7. This provides current flow between the drain and source of the floating gate transistor 3.

The threshold voltage of the transistor 3 is raised as is in the aforementioned case. On the other hand, the threshold voltage of the floating gate transistor 2 remains neutralized to about 2V to 3V. Thus, with a difference between the threshold voltages of the floating gate transistors 2 and 3, the option circuit 1a is made to store "1".

All the option circuits 1a in the CAM are subjected to the foregoing process before shipment of the device, so that either "0" or "1" is stored (programmed) in each.

Next, an operation in the case where the device is used by a user after shipment of the device thus programmed will be described below. For conveniences' sake, "0" is assumed to be stored (programmed) in the option circuit 1a. When the device is powered on, the bias voltage Vgate as an output of the bias voltage generating circuit 10 is set to Vcc, and an output VB of the bias voltage generating circuit 11 is boosted to about twice of the threshold voltages of the N-type transistors 4 and 5 (boosted to about 2V). As a result both the N-type transistors 4 and 5 become conductive. Here, gates of the transistors 2 and 3 are supplied with the bias voltage Vgate (=power source voltage Vcc), and this bias voltage Vgate is a medial voltage that is higher than the threshold of the floating gate transistors 3, while lower than the threshold voltage of the floating gate transistor 2. Therefore, the floating gate transistor 3 is turned on, while the floating gate transistor 2 is turned off.

Accordingly, the output OUT1 (output of the option circuit 1a) is pulled down to the "L" level by the floating gate transistor 3 and the N-type transistor 5. Further, since the output OUT1 is supplied to the gate of the P-type transistor 8, the fall of the output OUT1 to the "L" level causes the P-type transistor 8 to become conductive, but since the floating gate transistor 2 is non-conductive, the potential at the node N3 is pulled up completely to the level of the power source voltage Vcc. This pulling-up of the potential at the node N3 to the Vcc level causes the P-type transistor 9, whose gate is supplied with the same, becomes non-conductive, while the node N4 becomes completely to the Vss level. At this stage, the nodes N3 and N4 are completely at the power source voltage Vcc level and at the power source voltage Vss level, respectively, and therefore, DC current no longer flows. The output OUT1 becomes "0".

Incidentally, the case where the output OUT1 becomes "1" is a case in which the relationship between the floating gate transistors 2 and 3 regarding the height of threshold voltages thereof is inverted, and the subsequent process is identical to the operation described above. Therefore, detailed description is omitted herein.

The option circuit 1a operates in the manner as described above, and after being powered on, the foregoing state is latched. An identical state is latched for each of the all other option circuits 1b, 1c (not shown), . . . , and either "0" or "1" is outputted from each circuit.

The above-described conventional option circuit 1a shown in FIG. 5, however, undergoes a drawback as described below.

When the power source voltage Vcc becomes lower, this causes the voltage supplied to gates of flash cells (floating gate transistors 2 and 3 ) to become lower as well. The threshold voltages of the flash cells (about 2V to 3V) are extremely high as compared with threshold voltages of other transistors (about 1V), and when the gate voltages become lower than the threshold voltages of the flash cells, the option circuit cannot operate.

This may be, for example, solved by adding a voltage obtained by raising the power source voltage Vcc to the bias voltage Vgate. Alternatively, this may be solved by erasing the flash cells and lowering the threshold voltages. Such schemes, however, are disadvantageous since time required for testing may be increased and reliability may be adversely affected.

In the case of only actuation with a low voltage, a fixed voltage obtained by raising the power source voltage Vcc may be added to the bias voltage Vgate. However, in the case where both actuation with a low voltage and actuation with a normal voltage are required, such simple addition of the boosted power source voltage Vcc results in that, when the power source voltage Vcc is a normal voltage, the bias voltage Vgate becomes too higher for the boost. When the bias voltage Vgate is thus too high, the floating gate transistors 2 and 3 are likely not turned off, thereby not allowing the option circuit 1a shown in FIG. 5 to output "1" as the output OUT1.

To overcome this problem, additional provision of a voltage detecting circuit is required for switching the gate voltage between the normal voltage and the low voltage. In this case, however, behaviors upon switching of the voltage mode, variation of the switching voltage depending on changes in the process and the operational environments, and power consumption by the detecting circuit will arise as problems. Correspondence to the normal voltage or the low voltage may be set by option, but a circuit for setting the option itself cannot normally operate if the supplied voltage varies. Therefore, this cannot be an overall solution.

SUMMARY OF THE INVENTION

The present invention was made in light of the foregoing problems, and an object of the present invention is to provide a semiconductor memory device designed so as to normally operate with any one of a plurality of power source voltages without changing characteristics and reliability of flush cells, and to maintain stable behavior when the power source voltages fluctuate.

To achieve the foregoing object, the semiconductor memory device in accordance with the present invention includes (1) first and second transistors of a floating gate type, programmed so as to have threshold voltages differing each other, respectively, (2) a retaining circuit for producing binary data according to a difference between the threshold voltages upon the turning-on of the first and second transistors and retaining the binary data, and (3) a bias voltage switching circuit. In the case where being actuated with a first power source voltage, the bias voltage switching circuit selects a voltage obtained by raising the first power source voltage while a set-up signal is being inputted, whereas selects the first power source voltage at the other times, and outputs the selected voltage to the gates of the first and second transistors. In the case where being actuated with a second power source voltage lower than the first power source voltage, the bias voltage switching circuit selects a voltage obtained by raising the second power source voltage while the set-up signal is being inputted, whereas selects the second power source voltage while the second power source voltage exceeds a normal value, and outputs the selected voltage to the gates of the first and second transistors.

With the foregoing invention, in the case where the semiconductor memory device is actuated with the first power source voltage, a voltage obtained by raising the first power source voltage is selected from the bias voltage switching circuit while the set-up signal is being inputted (the set-up signal is on), and the selected voltage is sent to the gates of the first and second transistors of the floating gate type. On the other hand, when the set-up signal is not inputted (the set-up signal is off), the first power source voltage is selected from the bias voltage switching circuit, and is sent to the gates of the first and second transistors of the floating gate type. In any one of the foregoing cases, according to the programmed threshold voltages, one of the first and second transistors is on while the other is off. With this, the retaining circuit generates binary data based on a difference between the foregoing threshold voltages of the transistors, and retains the same.

When the first power source voltage is supplied, if the first power source voltage has a higher value than a normal value for a certain reason, the binary data is maintained since the first and second transistors are programmed as described above. On the other hand, if the first power source voltage has a lower value than a normal value for a certain reason, the first and second transistors further shifts to a high impedance state, and the binary data retained by the retaining circuit is therefore maintained.

Incidentally, in the case where the semiconductor memory device is actuated with a low power source voltage, a voltage supplied to the gates of the first and second transistors becomes low as well. Since the threshold voltages of the first and second transistors are extremely high (several times high) as compared with those of other transistors of non-floating-gate types, this leads to an inconvenience of incapability of actuating the semiconductor memory device with a low power source voltage.

To solve the foregoing problem, according to the present invention, in the case where the semiconductor memory device is actuated with the second power source voltage (lower than the first power source voltage), a voltage obtained by raising the second power source voltage is selected in response to input of the set-up signal, and is sent to the gates of the first and second transistors of the floating gate type from the bias voltage switching circuit. Thus, in the case where the semiconductor memory device is actuated with the second power source voltage, which is lower than the first power source voltage, a voltage obtained by raising the second power source voltage is selected by the bias voltage switching circuit and sent to the gates of the first and second transistors, thereby causing the semiconductor memory device to normally operate. In result, the foregoing inconvenience can be surely avoided.

In the case where the second power source voltage, when supplied, becomes higher than a normal value for a certain reason, the voltage obtained by raising the second power source voltage possibly becomes further higher than the higher one among the foregoing two threshold voltages. In this case, even if the threshold voltages are programmed so that one is higher than the other, the transistor that is off when the second power source voltage is normal (the transistor of the floating gate type that has a higher threshold voltage than that of the other transistor) is likely turned on in malfunction, thereby inverting the binary data retained by the retaining circuit.

To cope with such a problem, according to the present invention, the foregoing bias voltage switching circuit in this case selects the foregoing second power source voltage and outputs the same to the gates of the first and second transistors. This causes the output of the bias voltage switching circuit to drop from the level of the voltage obtained by raising the second power source voltage toward the second power source voltage level.

In the voltage lowering process, when the output of the bias voltage switching circuit comes to have an appropriate value between the second power source voltage and the voltage obtained by raising the second power source voltage (i.e., when the voltage outputted to the gates of the first and second transistors becomes lower than the higher one among the foregoing threshold voltages), the transistor turned on in malfunction is turned off, thereby allowing the foregoing binary data to recover to the state prior to the inversion. Then, a voltage obtained by raising the second power source voltage is outputted from the bias voltage switching circuit. On the other hand, in the case where the second power source voltage becomes lower than a normal value for a certain reason, the first and second transistors further shifts to a high impedance state, thereby permitting the binary data retained by the retaining circuit to be maintained.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a circuit diagram showing an example of an arrangement of a semiconductor memory device in accordance with the present invention.

FIG. 2(a) is a timing chart after the circuit in a low voltage version is powered on, while FIG. 2(b) is a timing chart after the circuit in a normal voltage version is powered on.

FIG. 3(a) is a timing chart explaining a behavior of the semiconductor memory device in response to fluctuations of a power source voltage in the case of the normal voltage version, while

FIG. 5 is a circuit diagram illustrating an example of an arrangement of a conventional semiconductor memory device.

DESCRIPTION OF THE PREFERRED EMBODIMENTS

Figure 3A:
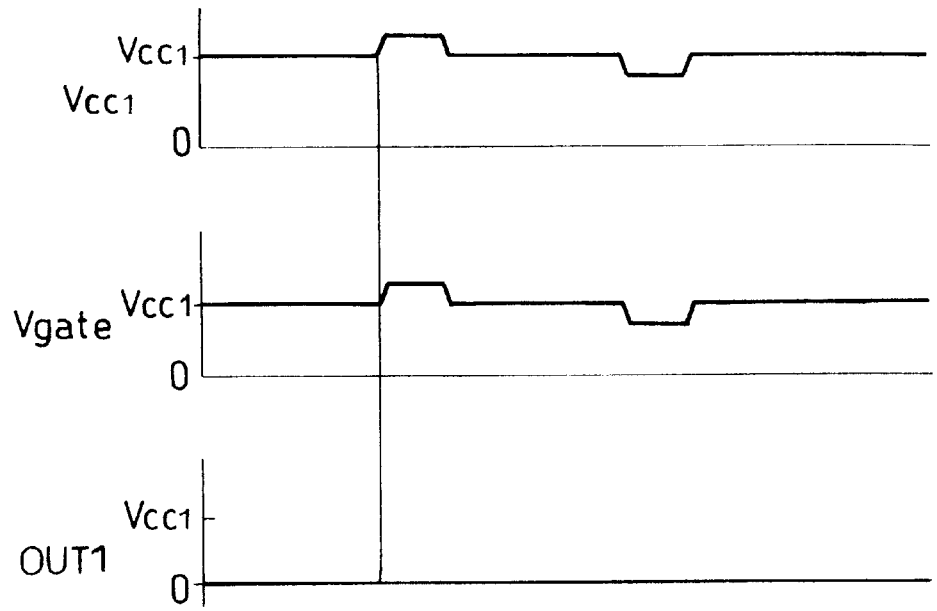

The following description will explain an embodiment of the present invention while referring to FIGS. 1 through 4.

As an example of a semiconductor memory device in accordance with the present invention, option circuits 27a and 27b are shown in FIG. 1. Here, the option circuit 27a is designed so as to switch between an element (hereinafter referred to as a normal voltage version) which operates in a normal manner in the case where a power source voltage (normal voltage, first power source voltage) is supplied and an element (hereinafter referred to as a low voltage version) which operates in a normal manner in the case where a voltage lower than the foregoing power source voltage (second power source voltage) is supplied, and the option circuit 27b is a common circuit designed to store defect addresses, the device initial state, etc.

In FIG. 1, the option circuit 27a is composed of two floating gate transistors 12 and 13, N-type transistors 14, 15, 16, 17, 21, and 22, and P-type transistors 18 and 19.

Each of the floating gate transistors 12 and 13 is provided with a floating gate formed on a semiconductor substrate with an insulating film provided therebetween, a control gate capacity-coupled with the floating gate via the insulating film, a substrate provided inside the semiconductor substrate and connected with a substrate portion below the floating gate, and an impurity-dispersed region of an opposite conductive type. Switching information regarding the foregoing normal voltage version or the low voltage version is stored in these floating gate transistors 12 and 13.

By combining the foregoing floating gate transistors 12 and 13 and making a quantity of charges stored in the floating gate of the floating gate transistor 12 and a quantity of charges stored in the floating gate of the floating gate transistor 13 differ from each other, binary-coded voltage data are stored (programmed) or outputted with use of the difference between the threshold voltages.

A drain of the floating gate transistor 12 and a source of the N-type transistor 14 are connected at a node N11, while a drain of the floating gate transistor 13 and a source of the N-type transistor 15 are connected at a node N12. A drain of the N-type transistor 14, a drain of the N-type transistor 21, and a drain of the P-type transistor 18 are connected at a node N13, while a drain of the N-type transistor 15, a drain of the N-type transistor 22, and a drain of the P-type transistor 19 are connected at a node N14.

A gate of the foregoing N-type transistor 21 and a gate of the P-type transistor 18 are both connected with the drain of the N-type transistor 22. A gate of the N-type transistor 22 and a gate of the P-type transistor 19 are both connected with the drain of the N-type transistor 21. A power source voltage Vcc is supplied to sources of the P-type transistors 18 and 19. A potential is pulled down to a Vss voltage level at each of the sources of the floating gate transistors 12 and 13.

Incidentally, the foregoing P-type transistor 18 and N-type transistor 21 form a first series circuit, while the foregoing P-type transistor 19 and N-type transistor 22 form a second series circuit. The foregoing first and second series circuits form a latch circuit 24 (retaining circuit), so that a voltage difference due to a difference between threshold voltages of the floating gate transistors 12 and 13 is retained in a binary data form in the latch circuit 24.

A bias voltage Vgate that is an output of a bias voltage switching circuit 20 is supplied to the gates of the floating gate transistors 12 and 13, while an output VB of a bias voltage switching circuit 25 is supplied to gates of the N-type transistors 14 and 15. A program voltage VPRG is supplied to the nodes N11 and N12 via the N-type transistors 16 and 17, so that current is applicable to the floating gate transistors 12 and 13. To gates of the N-type transistors 16 and 17, a program signal PRG1 and a program signal PRG2 are supplied, respectively.

An output OUT1 of the latch circuit 24 and a set-up signal SETUP are supplied to an OR gate 30 (logical summation circuit), and an output of the OR gate 30 and a program signal PROG are supplied to the bias voltage switching circuit 20.

Next, an operation of the foregoing option circuit 27a upon the turning-up of the power source and upon the setting-up will be explained below. FIG. 2 is a timing chart upon the turning-up of the power source and the setting-up of the option circuit 27a.

In the present embodiment, a case where the floating gate transistor 13 is programmed to have a threshold voltage of not lower than a power source voltage (the threshold voltage of the floating gate transistor 12 remains neutralized to about 2V to 3V) and the output OUT1 of the option circuit 27a shifts to an "H" level of binary logic is defined as a case where the option circuit 27a functions as a lower voltage version. Conversely, a case where the floating gate transistor 12 is programmed to have a threshold voltage of not lower than a power source voltage (the threshold voltage of the floating gate transistor 13 remains neutralized to about 2V to 3V) and the output OUT1 of the option circuit 27a shifts to an "L" level of binary logic is defined as a case where the option circuit 27a functions as a normal voltage version.

Incidentally, since the method described in the "BACKGROUND OF THE INVENTION" part is applied as a method for programming the floating-gate-type transistors 12 and 13, detailed descriptions about the method is omitted here.

In the case of the arrangement shown in FIG. 1, the setting-up is performed after the turning-on of the power source, and here, when the set-up signal SETUP shifts from the "L" level (ground level) to the "H" level (power source voltage level), the output of the foregoing OR gate 30 shifts from the "L" level to the "H" level. The output of the OR gate 30 is supplied to the foregoing bias switching circuit 20, then, in the case where the output of the OR gate 30 is at the "H" level, a raised voltage (a voltage of 1.5 times the power source voltage) is selected and outputted as the bias voltage Vgate, while the power source voltage per se is outputted as the bias voltage Vgate in the case where the output of the OR gate 30 is at the "L" level.

Here, the output VB of the bias voltage switching circuit 25 is raised to about 2 times the threshold voltage of the N-type transistors 14 and 15 (that is, to about 2V), thereby causing the N-type transistors 14 and 15 to become in the ON state.

In the case of the low voltage version, let the power source voltage supplied be Vcc2 (second power source voltage), and after the setting-up, the option circuit 27a normally operates when a voltage of 1.5·Vcc2 is supplied as the bias voltage Vgate to each of the floating gate transistors 12 and 13.

In this case, the floating gate transistor 13 is programmed to have a threshold voltage of not lower than the power source voltage Vcc2, while the threshold voltage of the floating gate transistor 12 is neutralized to about 2V to 3V. Therefore, in the case where the bias voltage Vgate is 1.5·Vcc2, the floating gate transistor 13 is turned off, while the floating gate transistor 12 is turned on.

As a result, the floating gate transistor 12 and the N-type transistor 14 cause the output /OUT1 to fall to the "L" level (ground level). Since the output /OUT1 is supplied to the gate of the P-type transistor 19, the drop of the output /OUT 1 to the "L" level causes the P-type transistor 19 to be turned on. Since, however, the floating gate transistor 13 is off, a potential of the node 14 is raised completely to a level of the power source voltage Vcc2. This rise of the potential at the node N14 to the power source voltage Vcc2 level causes the P-type transistor 18, whose gate is supplied with the voltage at the power source voltage Vcc2 level from the node N14, to be turned off, while the N-type transistor 21, whose gate is supplied with same, to be turned on. As a result, the potential at the node N13 shifts completely to the Vss level. At this stage, since the potentials at the nodes 13 and 14 are completely at the Vss level and at the power source voltage Vcc2 level, respectively, DC current no longer flows. The output OUT shifts to the "H" level (power source voltage Vcc2 level).

Thereafter, when the set-up signal SETUP shifts to the "L" level, the potential at the node N14 to be supplied to the OR gate 30 is maintained at the "H" level, whereby the output of the OR gate 30 remains at the "H" level. This results in that the bias voltage switching circuit 20 continues outputting the voltage of 1.5·Vcc2 (see the Vgate waveform in FIG. 2(a)). Accordingly, as long as power is supplied, the output of the option circuit 27a is kept at the "H" level (see the OUT waveform in FIG. 2(a)), whereby the option circuit 27(a) normally operates.

On the other hand, in the case of the normal voltage version, a power source voltage Vcc1 (first power source voltage) higher than the foregoing power source voltage Vcc2 is assumed to be supplied. When the set-up signal SETUP shifts from the "L" level (ground level) to the "H" level (power source voltage Vcc1 level) in the setting-up following to the foregoing power supply (see the SETUP waveform in FIG. 2(b)), the output of the OR gate 30 shifts to the "H" level, thereby causing a voltage of 1.5·Vcc1 as the bias voltage Vgate to be supplied to the floating gate transistors 12 and 13 via the bias voltage switching circuit 20. Here, since the floating gate transistor 12 is programmed to have the threshold voltage of not lower than the power source voltage Vcc1 while the threshold voltage of the floating gate transistor 13 is neutralized to about 2V to 3V, each transistor operates as described below, whereby the output OUT1 shifts to the "L" level.

More specifically, ON-operations of the floating gate transistor 13 and the N-type transistor 15 causes the output OUT1 (potential of the node N14) to go down to the "L" level. Since the output OUT1 is supplied to the gate of the transistor 18, the P-type transistor 18 be turned on as the output OUT1 falls to the "L" level, while the floating gate transistor 12 is off, thereby raising the potential of the node N13 completely to the power source voltage Vcc1 level.

This rise of the potential at the node N13 to the power source voltage Vcc1 level causes the P-type transistor 19, whose gate is supplied with the voltage at the power source voltage Vcc1 level from the node N13, to be turned off, while the N-type transistor 22, whose gate is supplied with the same, to be turned on. As a result, the potential of the node N14 completely shifts to the Vss level (ground level). At this stage, since the potentials of the nodes N13 and N14 are completely to the power source voltage Vcc1 level and the Vss level, respectively, DC current no longer flows. The output OUT shifts to the "L" level.

Thereafter, when the set-up signal SETUP shifts from the "H" level to the "L" level, both the two signals (the set-up signal and the output OUT1) to be supplied to the OR gate 30 shift to the "L" level, whereby the OR gate 30 sends a signal at the "L" level to the bias switching circuit 20. This causes the bias voltage switching circuit 20 to output the power source voltage Vcc1 (see the Vgate waveform in FIG. 2(a)). In the normal voltage version case in which the option circuit 27a normally operates when the power source voltage Vcc1 is supplied as the bias voltage Vgate, the output of the option circuit 27a is kept at the "L" level as long as power is supplied (see the OUT waveform in FIG. 2(a)). When a voltage of Vcc1 is supplied as the bias voltage Vgate to the floating gate transistors 12 and 13, the option circuit 27a normally operates.

In this case, the floating gate transistor 12 is programmed to have a threshold voltage of not lower than the power source voltage Vcc1, while the threshold voltage of the floating gate transistor 13 remains neutralized to about 2V to 3V. Therefore, the floating gate transistor 13 is turned on, while the floating gate transistor 12 is turned off.

As a result, the floating gate transistor 13 and the N-type transistor 15 cause the output OUT1 to fall to the "L" level. Since the output OUT1 is supplied to the gate of the P-type transistor 18, the drop of the output OUT 1 to the "L" level causes the P-type transistor 18 to be turned on. Since, however, the floating gate transistor 12 is off, a potential of the node 13 is raised completely to a level of the power source voltage Vcc1. This rise of the potential at the node N13 to the power source voltage Vcc1 level causes the P-type transistor 19, whose gate is supplied with a voltage at the power source voltage Vcc1 level from the node N13, to be turned off, thereby causing the potential at the node N14 to shift completely to the Vss level. At this stage, since the potentials at the nodes N13 and N14 are completely at the power source voltage Vcc1 level and at the Vss level, respectively, DC current no longer flows. The output OUT shifts to the "L" level.

Here, in the case where a fluctuation occurs to the power source voltage when the power source voltage (either the power source voltage Vcc1 or the power source voltage Vcc2) is supplied in a steady state, an operation of the option circuit 27a in response to the fluctuation will be explained below, with reference to FIGS. 3(a) and 3(b).

First of all, in the normal voltage version case, when the power source voltage Vcc1 is in a normal state (except when the setting-up is performed), the power source voltage Vcc1 is outputted as the bias voltage Vgate from the bias switching circuit 20 as shown in FIG. 3(a), and the output OUT1 of the option circuit 27a maintains the "L" level as described above.

In the case where the power source voltage Vcc1 exceeds a normal value, the output OUT1 maintains the "L" level since the floating gate transistor 13 is programmed to have the threshold voltage lower than the threshold voltage of the floating gate transistor 12.

Conversely, in the case where the power source voltage Vcc1 becomes lower than a normal value, the floating gate transistors 13 and 12 further shifts to a high impedance state. Therefore, the output OUT1, retained by the latch circuit 24, remains at the "L" level.

On the other hand, in the low voltage version case, after the setting-up is performed, in a state in which the power source voltage Vcc2 is in a normal state, a voltage of 1.5·Vcc2 is outputted as the bias voltage Vgate from the bias switching circuit 20, and the output OUT1 of the option circuit 27a maintains the "H" level as described above.

Figure 3B:
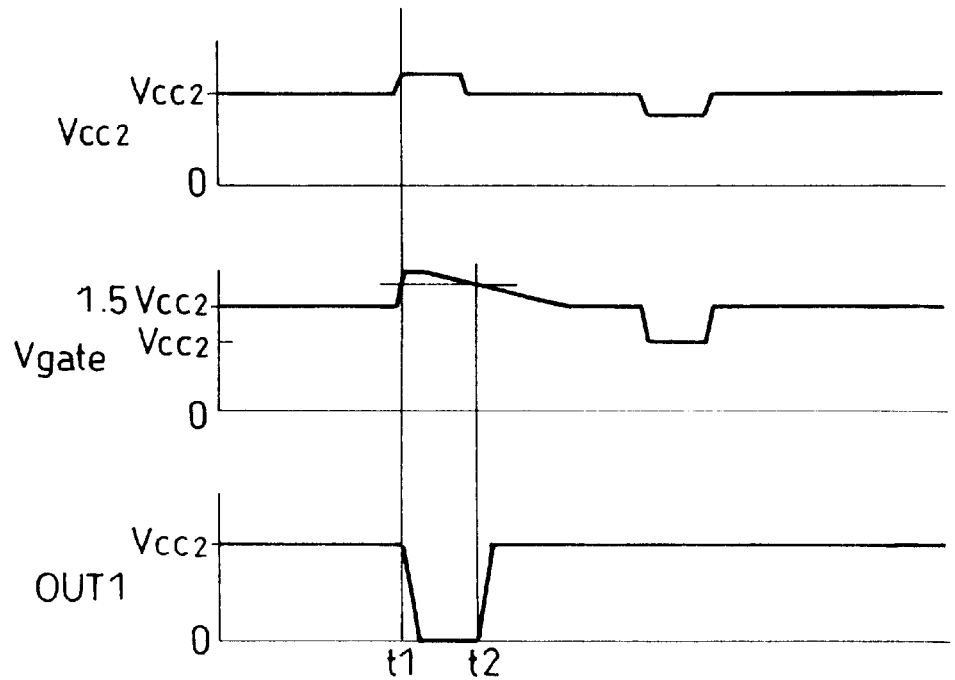
FIG. 3(b) is a timing chart explaining a behavior of the semiconductor memory device in response to fluctuations of a power source voltage in the case of the low voltage version.

If the power source voltage Vcc2 exceeds the normal value, the floating gate transistor 13 is sometimes turned on depending on the threshold voltage thereof, even though it is programmed so as to have a threshold voltage higher than that of the floating gate transistor 12, (in the case where the threshold voltage of the floating gate transistor 13 is set lower than a voltage at a timing t1 or at a timing t2 in FIG. 3(b)). As a result, the output OUT1 of the option circuit 27a possibly by mistake shifts to the "L" level (in a range of t1 to t2 in FIG. 3(b)).

In this case, since the output of the OR gate 30 shifts to the "L" level, the output of the bias voltage switching circuit 20 (bias voltage Vgate) falls toward the power source voltage Vcc2 level. Since an appropriate bias voltage Vgate level (higher than a level of the threshold voltage of the floating gate transistor 13 when the threshold voltage of the floating gate transistor 13 is higher than a level of a voltage obtained by raising the power source voltage vcc2) exists between the 1.5·Vcc2 level and the Vcc2 level, the output OUT1 recovers to the "H" level when the output of the bias voltage switching circuit 20 shifts to the appropriate level (at t2 in FIG. 3(b)). Thus, the output of the bias voltage switching circuit 20 recovers to 1.5·Vcc2, whereby the option circuit 27a normally operates (see Vgate of FIG. 3(b)).

On the other hand, if the power source voltage Vcc2 becomes lower than a normal value, the floating gate transistors 13 and 12 further shifts to a high impedance state. Therefore, the output OUT1, retained by the latch circuit 24, remains at the "H" level.

Incidentally, without the N-type transistors 21 and 22 like in conventional cases (in case designed as shown in FIG. 5), in the low voltage version case, an operation of the option circuit 27a immediately after power supply starts and an operation thereof in response to a fluctuation of the power source voltage become unstable, and there is no way to cope with it. Conversely, in the present embodiment, an unstable operation of the option circuit immediately after power supply starts and an operation thereof in response to a fluctuation of the power source voltage are surely stabilized, by causing the output OUT1 to be retained by the latch circuit 24, as described above.

However, it seems feasible to fix the output Vgate of the bias voltage switching circuit 20 to the Vss level after the output OUT1 of the option circuit 27a is confirmed, so that the output OUT1 is retained by the latch circuit 24. In this case, however, the content of the output OUT1 cannot be secured in the case where the power source voltage Vcc2, supplied at the timing of fixing the output of the bias voltage switching circuit 20 (bias voltage Vgate) to the Vss level, fluctuates.

In contrast, in the present embodiment, even with a fluctuation of the power source voltage Vcc2 at any timing, the output OUT1 is appropriately recovered whenever the power source voltage Vcc2 returns to a predetermined level (an appropriate power source voltage level), since the reading operation is performed at all times.

As described above, in the normal voltage version, the output Vgate of the bias voltage switching circuit 20 is automatically switched to the power source voltage Vcc1 by programming the floating gate transistor 12 (setting the threshold voltage of the transistor 12 to not lower than the power source voltage Vcc1), while in the low voltage version, the output of the bias voltage switching circuit 20 is automatically switched to the voltage of 1.5·Vcc2 obtained by raising the power source voltage Vcc2, by programming the floating gate transistor 13 (setting the threshold voltage of the transistor 13 to not lower than the power source voltage Vcc2). This provides an appropriate operation of the foregoing option circuit 27a.

As shown in FIG. 1, according to the present embodiment, the output of the bias voltage switching circuit 20 (bias voltage Vgate) is supplied also to gates of floating gate transistors 12 and 13 of the other option circuits 27b, 27c (not shown), . . . that are intended to store the defect addresses and the initial states of the device. Therefore, a stable operation is surely achieved by use of option circuits having the same arrangement, not depending on whether it is the normal voltage version or the low voltage version.

Furthermore, a plurality of option circuits with respective set power source voltage ranges may be prepared for nor less than three different power source voltage ranges. For example, option circuits 27a and 27b are prepared, and by setting (programming) the threshold voltages of the floating gate transistors 12 and 13 so that the option circuits 27a and 27b have outputs as shown in Table 1 when bias voltage is appropriate with respect to each power source voltage, thereby dealing with three different power source voltage ranges.

More specifically, the bias voltage Vgate is selected as follows, depending on outputs of the option circuits 27a and 27b and the set-up signal SETUP:

The bias voltage Vgate is set to 1.5·Vcc when the set-up signal SETUP is at the "H" level, irrespective of the outputs of the option circuits 27a and 27b; the bias voltage Vgate is set to Vcc when the set-up signal SETUP is at the "L" level while the outputs of the option circuits 27a and 27b are both at the "L" level; the bias voltage Vgate is set to 1.2·Vcc when the set-up signal SETUP is at the "L" level while one of the outputs of the option circuits 27a and 27b is at the "L" level and the other is at the "H" level; and, the bias voltage Vgate is set to 1.5·Vcc when the set-up signal SETUP is at the "L" level while the outputs of the option circuits 27a and 27b are both at the "H" level.

In the case where the bias voltage Vgate is too high to make the option circuit properly operate, the output of the option circuit, which should have been at the "H" level, shifts to the "L" level. As a result, the bias voltage Vgate is switched to a lower level, thereby recovering into a normal bias voltage range, as in the case of the arrangement prepared for two power source voltage ranges.

On the other hand, in the case where the bias voltage Vgate is too low to make the option circuit properly operate, the correct output is retained by the latch circuit 24. As a result, a normal operation is ensured, as in the case of the arrangement prepared for two power source voltage ranges.

As described above, it is possible to achieve appropriate performance with respect to three power source voltage ranges by employing two option circuits.

Incidentally, according to Table 1, both the modes in that one of the option circuits 27a and 27b is at the "L" level while the other is at the "H" level are intended to cope with the same power source voltage range. Since in both the modes the bias voltage Vgate is in a normal range with respect to the power source voltage in the foregoing range, the option circuits can make an appropriate output any way.

For example, in the case where the option circuits are actuated with the power source voltage Vcc in a range of 2.7V to 3.0V (this range is covered by both the ranges of 2.7V to 3.6V and 2.4V to 3.0V), the option circuit normally operates, irrelevant to whether the bias voltage Vgate is Vcc or 1.2·Vcc. In other words, in any one of the modes in which both the outputs of the option circuits 27a and 27b are at the "L" level, and in which either of them is at the "L" level while the other is at the "H" level, the respective set output can be obtained. This applies also to the case of the arrangement prepared for two ranges of the power source voltage Vcc, and according to the present invention, the option circuits can be made to appropriately operate even in the case where a plurality of different power source voltage ranges partly overlap.

Incidentally, the outputs of the option circuits of the respective power source voltage versions are programmed as shown in Table 1, and the operation in that the bias voltage switching circuit 20 automatically outputs bias voltages Vgate suitable for the respective cases is as described above.

TABLE 1

| OUTPUT OF OPTION CIRCUIT 27a | OUTPUT OF OPTION CIRCUIT 27b | POWER SOURCE VOLTAGE Vcc | BIAS VOLTAGE Vgate |
|---|---|---|---|
| "L" LEVEL | "L" LEVEL | 2.7 V–3.6 V | Vcc (2.7 V–3.6 V) |
| "L" LEVEL | "H" LEVEL | 2.4 V–3.0 V | 1.2 · Vcc (2.9 v–3.6 V) |

TABLE 1-continued

| OUTPUT OF OPTION CIRCUIT 27a | OUTPUT OF OPTION CIRCUIT 27b | POWER SOURCE VOLTAGE Vcc | BIAS VOLTAGE Vgate |
|---|---|---|---|
| "H" LEVEL | "L" LEVEL | 2.4 V–3.0 V | 1.2 · Vcc (2.9 V–3.6 V) |
| "H" LEVEL | "H" LEVEL | 1.8 V–2.4 V | 1.5 · Vcc (2.7 V–3.3 V) |

Figure 4:
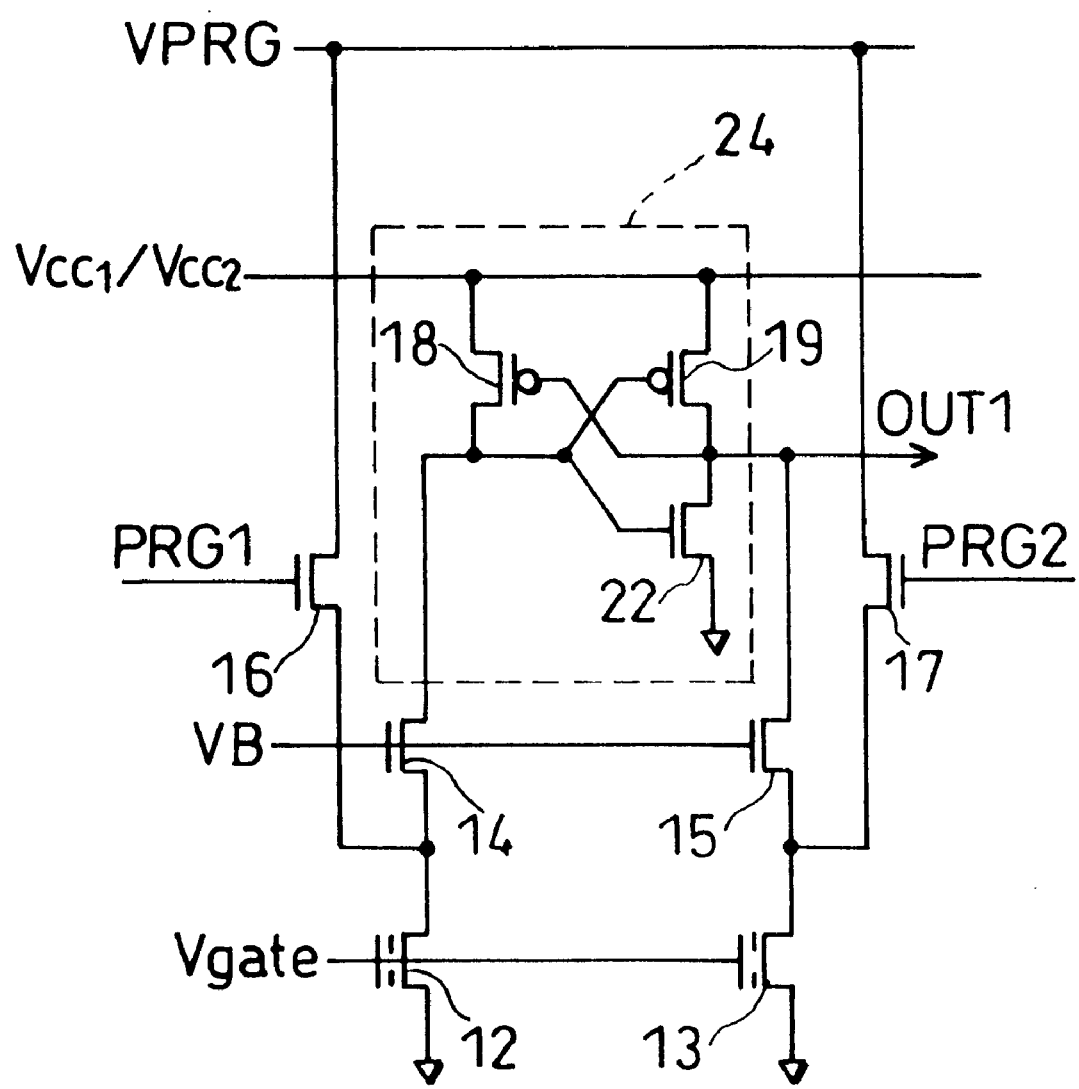
FIG. 4 is a circuit diagram illustrating an example of another arrangement of a semiconductor memory device in accordance with the present invention.

Furthermore, by designing the latch circuit 24 as shown in FIG. 4 in which the N-type transistor 21 as one of the N-type transistors of the latch circuit 24 of FIG. 1 is omitted, the number of elements can be reduced. When the output OUT1 of the latch circuit 24 is at the "H" level, the floating gate transistor 12, the N-type transistor 14, and the P-type transistor 19 are turned on, while the floating transistor 13, the N-type transistor 22, and the P-type transistor 18 are turned off. As a result, the "H" level of the output OUT1 is retained.

On the other hand, in the case of the arrangement of FIG. 4, the output OUT1 is at the "L" level, the floating gate transistor 12 and the P-type transistor 19 are turned off, while the floating gate transistor 13, the N-type transistor 22, and the P-type transistor 18 are turned on. As a result, the "L" level of the output OUT1 is retained.

In the case of the arrangement shown in FIG. 4, since the latch circuit 24 is unbalanced between the left and right parts irrespective of the level of the output OUT1, more attention has to be paid to the transistor size and the consumed current upon the switching of the bias voltage Vgate, than in the case of the arrangement shown in FIG. 1 (the latch circuit 24 composed of four elements).

Another applicable arrangement is such that option circuits having the foregoing latch circuits 24 and the conventional option circuits having no latch circuit may coexist among the plurality of option circuits. In this case, the option circuits incorporating the latch circuits 24 are adopted so as to set the power source voltage range, aimed to enhance safety, while the conventional option circuits incorporating no latch circuit are adopted as the other option circuits, so that the total number of elements is decreased.

As described above, a first semiconductor memory device in accordance with the present invention is provided with (1) first and second transistors of a floating gate type, programmed so as to have threshold voltages differing each other, respectively, (2) a retaining circuit for producing binary data according to a difference between the threshold voltages upon the turning-on of the first and second transistors and retaining the binary data, and (3) a bias voltage switching circuit. In the case where being actuated with a first power source voltage, the bias voltage switching circuit selects a voltage obtained by raising the first power source voltage while a set-up signal is being inputted, whereas selects the first power source voltage at the other times, and outputs the selected voltage to the gates of the first and second transistors. On the other hand, in the case where being actuated with a second power source voltage lower than the first power source voltage, the foregoing bias voltage switching circuit selects a voltage obtained by raising the second power source voltage while the set-up signal is being inputted, whereas selects the second power source voltage while the second power source voltage exceeds a normal value, and outputs the selected voltage to the gates of the first and second transistors.

With the foregoing invention, in the case where the semiconductor memory device is actuated with the first power source voltage, a voltage obtained by raising the first power source voltage is selected from the bias voltage switching circuit while the set-up signal is being inputted (the set-up signal is on), and the selected voltage is sent to the gates of the first and second transistors of the floating gate type. On the other hand, when the set-up signal is not inputted (the set-up signal is off), the first power source voltage is selected from the bias voltage switching circuit, and is sent to the gates of the first and second transistors of the floating gate type. In any one of the foregoing cases, one of the first and second transistors is on while the other is off. With this, the retaining circuit generates binary data based on a difference between the foregoing threshold voltages of the transistors, and retains the same.

When the first power source voltage is supplied, if the first power source voltage has a higher value than a normal value for a certain reason, the binary data is maintained since the first and second transistors are programmed as described above. On the other hand, if the first power source voltage has a lower value than a normal value for a certain reason, the first and second transistors further shifts to a high impedance state, and the binary data retained by the retaining circuit is therefore maintained.

Incidentally, in the case where the semiconductor memory device is actuated with a low power source voltage, a voltage supplied to the first and second transistors becomes low as well. Since the threshold voltages of the first and second transistors are extremely high (several times high) as compared with those of other transistors of non-floating-gate types, this leads to an inconvenience of incapability of actuating the semiconductor memory device with a low power source voltage.

To solve the foregoing problem, according to the present invention, in the case where the semiconductor memory device is actuated with the second power source voltage (lower than the first power source voltage), a voltage obtained by raising the second power source voltage is selected in response to input of the set-up signal, and is sent to the gates of the first and second transistors of the floating gate type from the bias voltage switching circuit. Thus, in the case where the semiconductor memory device is actuated with the second power source voltage, which is lower than the first power source voltage, a voltage obtained by raising the second power source voltage is selected by the bias voltage switching circuit and sent to the gates of the first and second transistors, thereby causing the semiconductor memory device to normally operate, resulting in that the foregoing inconvenience can be surely avoided.

In the case where the second power source voltage, when supplied, becomes higher than a normal value for a certain reason, the voltage obtained by raising the second power source voltage possibly becomes further higher than the higher one among the foregoing two threshold voltages. In this case, even if the threshold voltages are programmed so that one is higher than the other, the transistor that is off when the second power source voltage is normal (the transistor of the floating gate type that has a higher threshold voltage than that of the other transistor) is likely turned on in malfunction, thereby inverting the binary data retained by the retaining circuit.

To cope with such a problem, according to the present invention, the foregoing bias voltage switching circuit in this case selects the foregoing second power source voltage and outputs the same to the gates of the first and second transistors. This causes the output of the bias voltage switching circuit to drop from the level of the voltage obtained by raising the second power source voltage toward the second power source voltage level.

In the voltage lowering process, when the output of the bias voltage switching circuit comes to have an appropriate value between the second power source voltage and the voltage obtained by raising the second power source voltage (i.e., when the voltage outputted to the gates of the first and second transistors becomes lower than the higher one among the foregoing threshold voltages), the transistor turned on in malfunction is turned off, thereby allowing the foregoing binary data to recover to the state prior to the inversion. Then, a voltage obtained by raising the second power source voltage is outputted from the bias voltage switching circuit. On the other hand, in the case where the second power source voltage becomes lower than a normal value for a certain reason, the first and second transistors further shifts to a high impedance state, thereby permitting the binary data retained by the retaining circuit to be maintained.

As described above, a second semiconductor memory device in accordance with the present invention is characterized in that the retaining circuit includes (1) a first series circuit having a first P-type transistor and a first N-type transistor that are connected with each other in series in this order between the power source voltage level and the ground level, with gates thereof connected with each other, the first series circuit outputting a signal obtained by inverting an output signal of the retaining circuit via a node that connects the first P-type transistor and the first N-type transistor, and (2) a second series circuit having a second P-type transistor and a second N-type transistor that are connected with each other in series in this order between the power source voltage level and the ground level, with gates thereof connected with each other, the second series circuit outputting an output signal of the retaining circuit via a node that connects the second P-type transistor and the second N-type transistor, wherein (i) output of the first series circuit is supplied to gates of the second P-type transistor and the second N-type transistor of the second series circuit, while an output of the second series circuit is supplied to gates of the first P-type transistor and the first N-type transistor of the first series circuit, and (ii) the first and second transistors of the floating gate type are connected in a manner such that (a) when the first transistor of the floating gate type is on, the output of the first series circuit is at a ground level while the output of the second series circuit is at the power source voltage level, and (b) when the second transistor of the floating gate type is on, the output of the second series circuit is at a ground level while the output of the first series circuit shifts to the power source voltage level.

With the foregoing invention, in addition to the effect achieved with the foregoing first semiconductor memory device, when the first transistor of the floating gate type is on (here, the second transistor of the floating gate type is off), the output of the first series circuit shifts to the ground level, the second P-type transistor of the second series circuit is turned on, and the second N-type transistor thereof is turned off, thereby causing the output of the second series circuit to rise completely to the power source voltage level. This causes the first P-type transistor, whose gate is supplied with a voltage at the power source voltage level, to be turned off while the first N-type transistor, whose gate is supplied with the same, to be turned on. As a result, the output of the first series circuit is caused to fall completely to the ground level. At this stage, since the outputs of the first and second series circuits are completely at the ground level and at the power source voltage level, respectively, DC current no longer flows.

Further, when the second transistor of the floating gate type is on (here, the first transistor of the floating gate type is off), the output of the second series circuit shifts to the ground level, the first P-type transistor of the first series circuit is turned on while the first N-type transistor thereof is turned off. As a result, the output of the first series circuit rises completely to the power source voltage level. This causes the second P-type transistor, whose gate is supplied with a voltage at the power source voltage level, to be turned off while the second N-type transistor, whose gate is supplied with the same, to be turned on. As a result, the output of the second series circuit falls completely to the ground level. At this stage, since the outputs of the first and second series circuits are completely at the power source voltage level and at the ground level, respectively, DC current no longer flows.

As described above, a third semiconductor memory device of the present invention is the second semiconductor memory device further characterized by further comprising a logical summation circuit for receiving the output of the retaining circuit and the set-up signal and performing logical summation with respect to the two, wherein the bias voltage switching circuit selects a voltage obtained by raising a supplied power source voltage when supplied with a signal at the power source voltage level from the logical summation circuit, whereas selects the power source voltage when supplied with a signal at the ground level from the logical summation circuit.

According to the foregoing invention, in addition to the effect achieved by the second semiconductor memory device, the bias voltage switching circuit selects either the power source voltage supplied thereto, or a voltage obtained by raising the power source voltage, based on a result of logical summation of the retained data outputted and the set-up signal by the logical summation circuit, and sends the same to the gates of the first and second transistors. After the setting-up, the bias voltage switching circuit selects a voltage level to be outputted, based on the output of the retaining circuit.

When being actuated with the second power source voltage, if the second power source voltage becomes higher than a normal value for some reasons thereby causing malfunction of turning on the transistor that should have turned off with the second power source voltage at a normal level, a signal at the ground level is sent from the logical summation circuit to the bias voltage switching circuit even when a signal at the power source voltage level should have been outputted from the retaining circuit.

From the bias voltage switching circuit, the second power source voltage is selected and sent to the gates of the first and second transistors of the floating gate type. This causes the output of the bias voltage switching circuit to fall toward the second power source voltage level from the level of a voltage obtained by raising the second power source voltage. In the voltage lowering process, when the output of the bias voltage switching circuit comes to have an appropriate value between the second power source voltage and the voltage obtained by raising the second power source voltage, (when the voltage outputted to the gates of the first and second transistors become lower than the higher one among the foregoing threshold voltages), the transistor turned on in malfunction is turned off, thereby allowing the foregoing binary data to recover to that prior to inversion.

In result, a signal at the power source voltage level (the second power source voltage level) is outputted from the retaining circuit, and then, a signal at the power source voltage level is supplied to the logical summation circuit, thereby causing the output of the logical summation circuit to shift to the power source voltage level. This causes the bias voltage switching circuit to select a voltage obtained by raising the second power source voltage, which is sent to the gates of the first and second transistors of the floating gate type.

Thus, such a simple arrangement in that a logical summation circuit is provided, normal operations are ensured even in the case where the second power source voltage comes to have a higher voltage level than a normal level.

As described above, a fourth semiconductor memory device of the present invention comprises a plurality of memory circuits, each memory circuit being composed of first and second transistors of a floating gate type that are programmed so as to have threshold voltages differing to each other, respectively, and a retaining circuit for producing binary data according to a difference between the threshold voltages upon the turning on of the first and second transistors and retaining the produced binary data, wherein the threshold voltages are programmed so that those of one memory circuit differ from those of another memory circuit, and the semiconductor memory device further comprises a bias voltage switching circuit for, (i) in the case where being actuated with a first power source voltage, selecting a voltage obtained by raising the first power source voltage while a set-up signal is being inputted, whereas selecting the first power source voltage at the other times, and outputting the selected voltage to gates of the first and second transistors of the memory circuits, and (ii) in the case where being actuated with a second power source voltage lower than the first power source voltage, selecting a voltage obtained by raising the second power source voltage while the set-up signal is being inputted, whereas selecting the second power source voltage when the second power source voltage exceeds a normal value, and outputting the selected voltage to the gates of the first and second transistors of the memory circuits.

The foregoing invention ensures that proper performance is achieved in any one of a plurality of power source voltage ranges, by programming the memory circuits so as to have threshold voltages differing from each other. Each memory circuit is designed so as to make the same operation as the first semiconductor memory device, depending on a power source voltage.

As described above, a fifth semiconductor memory device of the present invention is the first semiconductor memory device further characterized in that the retaining circuit includes (1) a series circuit having a second P-type transistor and a second N-type transistor that are connected with each other in series in this order between the power source voltage level and the ground level, with gates thereof connected with each other, the series circuit outputting an output signal of the retaining circuit via a node that connects the second P-type transistor and the second N-type transistor, and (2) a first P-type transistor, whose gate is connected with the node of the series circuit, whose source is supplied with a voltage at a power source voltage level, and whose drain is connected with the gate of the second N-type transistor, wherein the first and second transistors of the floating gate type are connected in a manner such that, (i) when the first transistor of the floating gate type is on, a potential at the source of the first P-type transistor is at a ground level while the output of the series circuit is at the power source voltage level, and (ii) when the second transistor of the floating gate type is on, the output of the series circuit is at a ground level while the potential at the source of the first P-type transistor shifts to the power source voltage level.

According to the foregoing invention, in addition to the effect achieved by the first semiconductor memory device, when the first transistor of the floating gate type is turned on thereby causing the output of the first P-type transistor to shift to the ground level, the second P-type transistor of the series circuit is turned on while the second N-type transistor thereof is turned off, thereby causing the output of the series circuit to rise completely to the power source voltage level. This causes the first P-type transistor, whose gate is supplied with the power source voltage, to be turned off, thereby causing the potential at the drain of the first P-type transistor to fall completely to the ground level. As a result, DC current no longer flows.

Further, when the second transistor of the floating gate type is turned on, then, the output of the series circuit to shift to the ground level, thereby causing the first P-type transistor to be turned on. As a result, the potential at the drain of the first P-type transistor is raised completely to the power source voltage level. This causes the second P-type transistor, whose gate is supplied with the power source voltage, to be turned off while the second N-type transistor, whose gate is supplied with the power source voltage, to be turned on. This causes the output of the series circuit to fall completely to the ground level. As a result, DC current no longer flows.

Furthermore, since the foregoing semiconductor memory device of the foregoing invention is the second semiconductor memory device further characterized in that the first N-type transistor is omitted from the retaining circuit, the number of elements is decreased for the same.

As has been described so far, the semiconductor memory device of the present invention can be switched to any one of a plurality of power source voltage versions before shipment, without changing the characteristics and reliability of flush cells, and ensures stable actuation of other option circuits (for example, those used for storing redundancy information, etc.) with the power source voltage applied to the device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device, comprising:

first and second transistors of a floating gate type, programmed so as to have threshold voltages differing each other, respectively;

a retaining circuit for producing binary data according to a difference between the threshold voltages upon turning-on of said first and second transistors and retaining the binary data; and a bias voltage switching circuit for, in the case where being actuated with a first power source voltage, selecting a voltage obtained by raising the first power source voltage while a set-up signal is being inputted, whereas selecting the first power source voltage at the other times, and outputting the selected voltage to the gates of said first and second transistors, and, in the case where being actuated with a second power source voltage lower than the first power source voltage, selecting a voltage obtained by raising the second power source voltage while the set-up signal is being inputted, whereas selecting the second power source voltage while the second power source voltage exceeds a normal value, and outputting the selected voltage to the gates of said first and second transistors.

2. The semiconductor memory device as set forth in claim 1, wherein said retaining circuit includes:
   a first series circuit having a first P-type transistor and a first N-type transistor that are connected with each other in series in this order between a power source voltage level and a ground level, with gates thereof connected with each other, said first series circuit outputting a signal obtained by inverting an output signal of said retaining circuit via a node that connects said first P-type transistor and said first N-type transistor; and
   a second series circuit having a second P-type transistor and a second N-type transistor that are connected with each other in series in this order between the power source voltage level and the ground level, with gates thereof connected with each other, said second series circuit outputting an output signal of said retaining circuit via a node that connects said second P-type transistor and said second N-type transistor,
   wherein:
      an output of said first series circuit is supplied to gates of said second P-type transistor and said second N-type transistor of said second series circuit, while an output of said second series circuit is supplied to gates of said first P-type transistor and said first N-type transistor of said first series circuit;
      and said first and second transistors of the floating gate type are connected such that,
      when said first transistor of the floating gate type is on, the output of said first series circuit is at a ground level while the output of said second series circuit is at the power source voltage level, and
      when said second transistor of the floating gate type is on, the output of said second series circuit is at a ground level while the output of said first series circuit shifts to the power source voltage level.

3. The semiconductor memory device as set forth in claim 2, further comprising:
   a logical summation circuit for receiving the output of said retaining circuit and the set-up signal, and performing logical summation with respect to the two,
   wherein:
      said bias voltage switching circuit, when receiving a signal at the power source voltage level from said logical summation circuit, selects a voltage obtained by raising the power source voltage, whereas, when receiving a signal at the ground level therefrom, selects the power source voltage.

4. The semiconductor memory device as set forth in claim 1, wherein said retaining circuit includes:
   a series circuit having a second P-type transistor and an N-type transistor that are connected with each other in series in this order between a power source voltage level and a ground level, with gates thereof connected with each other, said series circuit outputting an output signal of said retaining circuit via a node that connects said second P-type transistor and said N-type transistor; and
   a first P-type transistor whose gate is connected with the node of said series circuit, to whose source a voltage at the power source voltage level is supplied, and whose drain is connected with the gate of said N-type transistor,
   wherein said first and second transistors of the floating gate type are connected such that, when said first transistor of the floating gate type is on, a potential at the source of said first P-type transistor is at a ground level while the output of said series circuit is at the power source voltage level, and when said second transistor of the floating gate type is on, the output of said series circuit is at a ground level while the potential at the source of said first P-type transistor shifts to the power source voltage level.

5. A semiconductor memory device, comprising a plurality of memory circuits, each memory circuit being composed of first and second transistors of a floating gate type that are programmed so as to have threshold voltages differing to each other, respectively, and a retaining circuit for producing binary data according to a difference between the threshold voltages upon turning on of said first and second transistors and retaining the produced binary data, wherein the threshold voltages are programmed so that those of one memory circuit differ from those of another memory circuit,
   said semiconductor memory device further comprising a bias voltage switching circuit for,
      in the case where being actuated with a first power source voltage, selecting a voltage obtained by raising the first power source voltage while a set-up signal is being inputted, whereas selecting the first power source voltage at the other times, and outputting the selected voltage to gates of said first and second transistors of said memory circuits, and
      in the case where being actuated with a second power source voltage lower than the first power source voltage, selecting a voltage obtained by raising the second power source voltage while the set-up signal is being inputted, whereas selecting the second power source voltage when the second power source voltage exceeds a normal value, and outputting the selected voltage to the gates of said first and second transistors of said memory circuits.

6. A semiconductor memory device, including a first transistor of a floating gate type, a second transistor of a floating gate type, and a data retaining section for retaining binary data, a gate of said first transistor of the floating gate type an d a gate of said second transistor of the floating gate type being connected and a quantity of charges stored in said first transistor of the floating gate type being made different from that in said second transistor of the floating gate so that said data retaining section retains the binary data based on a difference between threshold voltages of said first and second transistors of the floating gate type,
   said semiconductor memory device, further comprising a control circuit designed so as to:
      output a first logical level when being actuated with a first power source voltage;
      output a second logical level when being actuated with a second power source voltage lower than the first logical level;
      supply the first power source voltage to the gates of said first and second transistors of the floating gate type in the case where the output is at the first logical level; and
      supply a voltage obtained by raising the second power source voltage to the gates of said first and second transistors of the floating gate type in the case where the output is at the second logical level.

7. The semiconductor memory device as set forth in claim 6, wherein said data retaining section includes a parallel circuit composed of two series circuits, one of the series circuits being composed of a first transistor of a second conductive type and a third transistor of a first conductive type, the other series circuit being composed of a second transistor of the second conductive type and a fourth transistor of the first conductive type, wherein:
gates of said first transistor of the second conductive type and said third transistor of the first conductive type are connected with a node connecting said second transistor of the second conductive type and said fourth transistor of the first conductive type;

gates of said second transistor of the second conductive type and the fourth transistor or the first conductive type are connected with a node connecting said first transistor of the second conductive type and said third transistor of the first conductive type; and a power source voltage is applied to said first and second transistors of the second conductive type, while a ground voltage is applied to said third and fourth transistors of the first conductive type.

8. The semiconductor memory device as set forth in claim 6, wherein said control circuit comprises a bias voltage switching circuit for switching, in accordance with an output of said data retaining section, of supplying the first and second power source voltages to the gates of said first and second transistors of the floating gate type.

9. The semiconductor memory device as set forth in claim 6, wherein said control circuit comprises:
a logical summation circuit for conducting a logical summation of an output of said data retaining section and a set-up signal; and
a bias voltage switching circuit for switching, in response to said logical summation circuit, of supplying the first and second power source voltages to the gates of said first and second transistors of the floating gate type.

10. The semiconductor memory device, as set forth in claim 9, wherein:
said bias voltage switching circuit supplies the first power source voltage to the gates of said first and second transistors of the floating gate type in the case where the logical summation of said logical summation circuit is at the first logical level, while supplies the voltage obtained by raising the second power source voltage to the gates of said first and second transistors of the floating gate type in the case where the logical summation of said logical summation circuit is at the second logical level.

11. The semiconductor memory device as set forth in claim 6, wherein:
said data retaining section includes a parallel circuit composed of a series circuit and a second transistor of a second conductive type, the series circuit being composed of a first transistor of the second conductive type and a third transistor of a first conductive type, wherein:
gates of said first transistor of the second conductive type and said third transistor of the first conductive type are connected with a drain of said second transistor of the second conductive type;

a gate of said second transistor of the second conductive type is connected with a node connecting said first transistor of the second conductive type and said third transistor of the first conductive type;

a power source voltage is applied to said first and second transistors of the second conductive type; and a ground voltage is applied to said third transistor of the first conductive type.

* * * * *